(12) United States Patent
Baba (10) Patent No.: US 11,500,025 B2
(45) Date of Patent: Nov. 15, 2022

(54) EQUIPMENT MANAGEMENT METHOD AND EQUIPMENT MANAGEMENT APPARATUS

(71) Applicant: KYOCERA Corporation, Kyoto (JP)

(72) Inventor: Masahiro Baba, Kawasaki (JP)

(73) Assignee: KYOCERA CORPORATION, Kyoto (JP)

( * ) Notice: Subject to any disclaimer, the term of this patent is extended or adjusted under 35 U.S.C. 154(b) by 361 days.

(21) Appl. No.: 16/616,969

(22) PCT Filed: May 30, 2018

(86) PCT No.: PCT/JP2018/020756
§ 371 (c)(1),
(2) Date: Nov. 26, 2019

(87) PCT Pub. No.: WO2018/221583
PCT Pub. Date: Dec. 6, 2018

(65) Prior Publication Data
US 2020/0292621 A1    Sep. 17, 2020

(30) Foreign Application Priority Data

May 30, 2017  (JP) .............................. JP2017-106301

(51) Int. Cl.
| H01M 8/04664 | (2016.01) |
| G01R 31/371 | (2019.01) |
| H01M 8/0432 | (2016.01) |
| G05B 23/02 | (2006.01) |

(52) U.S. Cl.
CPC ....... G01R 31/371 (2019.01); G05B 23/0283 (2013.01); H01M 8/0432 (2013.01); H01M 8/04679 (2013.01)

(58) Field of Classification Search
CPC ... G01R 31/371; G06Q 10/00; H01M 8/0432; H01M 8/04679; H02J 13/00; H02J 3/38; Y02E 60/50
See application file for complete search history.

(56) References Cited

U.S. PATENT DOCUMENTS

| 8,125,530 B2 | 2/2012 | Ooga et al. |
| 2016/0049708 A1 | 2/2016 | Kuwabara |
| 2018/0336647 A1 | 11/2018 | Nakayama et al. |

FOREIGN PATENT DOCUMENTS

| JP | H398138 A | 4/1991 |
| JP | H8214139 A | 8/1996 |
| JP | 200292769 A | 3/2002 |
| JP | 2002300672 A | 10/2002 |

(Continued)

OTHER PUBLICATIONS

Machine Translation WO2017073602 (Year: 2017).*

*Primary Examiner* — Victoria H Lynch
(74) *Attorney, Agent, or Firm* — Hauptman Ham, LLP (57) ABSTRACT

An equipment management method comprises a step A of predicting, at an equipment management apparatus, occurrence of a first abnormality which is an abnormality occurred in a fuel cell system and not predicted by the fuel cell system; and a step B of transmitting, at the equipment management apparatus, a message associated with a prediction for the occurrence of the first abnormality when the occurrence of the first abnormality is predicted.

7 Claims, 6 Drawing Sheets

(56) References Cited

FOREIGN PATENT DOCUMENTS

| | | |
|---|---|---|
| JP | 2002-334709 A | 11/2002 |
| JP | 2003-32899 A | 1/2003 |
| JP | 2003-223917 A | 8/2003 |
| JP | 2005122541 A | 5/2005 |
| JP | 2005-182399 A | 7/2005 |
| JP | 2008-226674 A | 9/2008 |
| JP | 2014-203605 A | 10/2014 |
| JP | 2014212496 A | 11/2014 |
| JP | 2017-73857 A | 4/2017 |
| WO | 2007080921 A1 | 7/2007 |
| WO | 2017/073602 A1 | 5/2017 |

\* cited by examiner

EQUIPMENT MANAGEMENT METHOD AND EQUIPMENT MANAGEMENT APPARATUS

RELATED APPLICATIONS

The present application is a National Phase of International Application No. PCT/JP2018/020756, filed May 30, 2018, and claims priority based on Japanese Patent Application No. 2017-106301, filed May 30, 2017.

TECHNICAL FIELD

The present invention relates to an equipment management method and an equipment management apparatus.

BACKGROUND ART

An equipment management system that manages various pieces of information on a plurality of pieces of equipment is known. The various pieces of information include basic information on equipment and maintenance information. The basic information includes, for example, an installation date, a predetermined service life, a rated power consumption, and the like. The maintenance information includes a history of past maintenance (for example, Patent Literature 1).

CITATION LIST

Patent Literature

Patent Literature 1: Japanese application publication No. 2005-182399

SUMMARY OF INVENTION

An equipment management method according to a first disclosure comprises a step A of predicting, at an equipment management apparatus, occurrence of a first abnormality which is an abnormality occurred in a fuel cell system and not predicted by the fuel cell system; and a step B of transmitting, at the equipment management apparatus, a message associated with a prediction for the occurrence of the first abnormality when the occurrence of the first abnormality is predicted.

An equipment management apparatus according to a second disclosure comprises a controller configured to predict occurrence of a first abnormality which is an abnormality occurred in a fuel cell system and not predicted by the fuel cell system; and a transmitter configured to transmit a message associated with a prediction for the occurrence of the first abnormality when the occurrence of the first abnormality is predicted.

DESCRIPTION OF EMBODIMENTS

Hereinafter, an embodiment will be described. Note that, in description of the drawings below, the same or similar sections are attached with the same or similar reference signs. However, it should be noted that the drawings are schematic drawings, and a ratio of each dimension and the like may be different from actual ones.

Accordingly, a specific dimension and the like need to be determined in consideration of the description below. Further, between mutual drawings, there may also be a case where sections have dimensions that are different from each other in relationships or ratios as a matter of course.

SUMMARY OF DISCLOSURE

A case where an equipment managed by an equipment management system mentioned in background art is a fuel cell system is considered. The fuel cell system has an abnormality avoiding function as a function of the fuel cell system and is configured to perform operation of avoiding a predicted abnormality in a case where occurrence of an abnormality is predicted.

However, as a result of earnest examination, the inventors and the like have found a phenomenon that it is not possible to appropriately avoid an abnormality only by an abnormality avoiding function included in a fuel cell system.

In the following disclosure, an equipment management method and an equipment management apparatus to enable appropriate avoidance of an abnormality in a fuel cell system will be described in order to solve the above-described problem.

EMBODIMENT (Equipment Management System)

Figure 1:
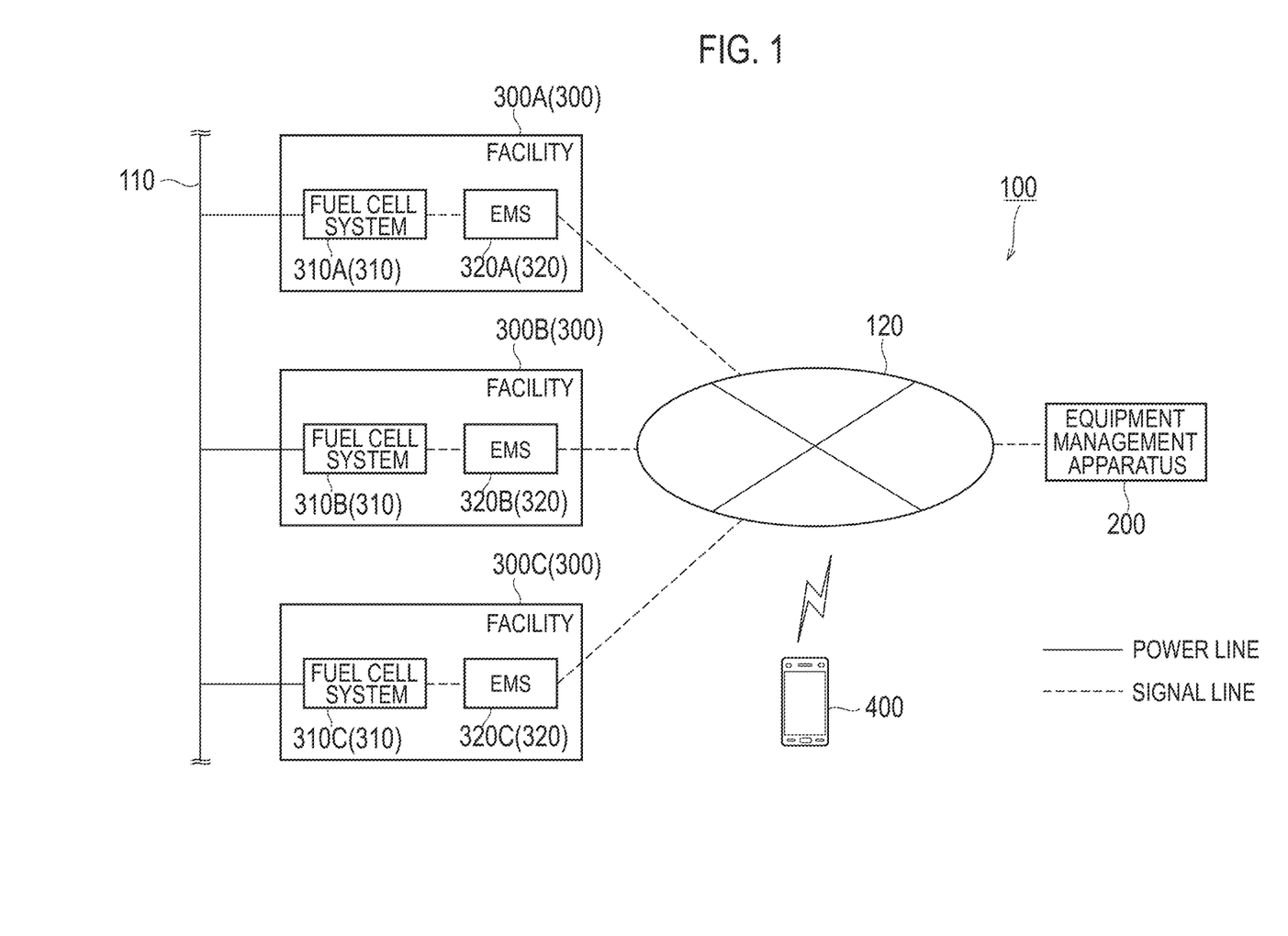
FIG. 1 is a diagram illustrating an equipment management system 100 according to an embodiment.

Hereinafter, an equipment management system according to an embodiment will be described. As illustrated in FIG. 1, an equipment management system 100 includes an equipment management apparatus 200, a facility 300, and a predetermined terminal 400. FIG. 1 exemplifies facilities 300A to 300C as the facility 300. The equipment management apparatus 200 and the facility 300 are connected to a network 120. The network 120 may provide a line between the equipment management apparatus 200 and the facility 300, and a line between the equipment management apparatus 200 and the predetermined terminal 400. The network 120 is, for example, the Internet. As the network 120, a dedicated line, such as a VPN, may be provided.

The equipment management apparatus 200 manages equipment provided in the facility 300. Details of the equipment management apparatus 200 will be described later (see FIG. 3).

The facility 300 has a fuel cell system 310 and an EMS 320. The fuel cell system 310 includes equipment that generates power using fuel, such as gas. Details of the fuel cell system 310 will be described later (see FIG. 2). The EMS 320 is equipment (energy management system) that controls equipment provided in the facility 300.

The facility 300 may have load equipment that consumes power. The load equipment is, for example, air conditioning equipment, lighting equipment, audio visual (AV) equipment, and the like. The facility 300 may have a distributed power supply other than the fuel cell system 310. The distributed power supply may include, for example, equipment that generates power using natural energy, such as solar light, wind power, geothermal energy, and may include storage battery equipment.

The predetermined terminal 400 may be a terminal held by a manager who manages equipment provided in the facility 300. The predetermined terminal 400 may be a terminal held by a worker who performs maintenance of equipment provided in the facility 300. The predetermined terminal 400 may be a terminal belonging to a company, such as a power generation company, a power transmission and distribution company, a retailer. The predetermined terminal 400 may be a smartphone, a tablet terminal, or a personal computer.

Here, the equipment management system 100 may have a power management server. The power management server transmits, for example, a power flow control message requesting control of a power flow amount from a power grid 110 to the facility 300, a reverse power flow control message requesting control of a reverse power flow amount from the facility 300 to the power grid 110, a power control message requesting control of the fuel cell system 310 (distributed power supply) provided in the facility 300, and the like to the facility 300.

(Fuel Cell System)

Figure 2:
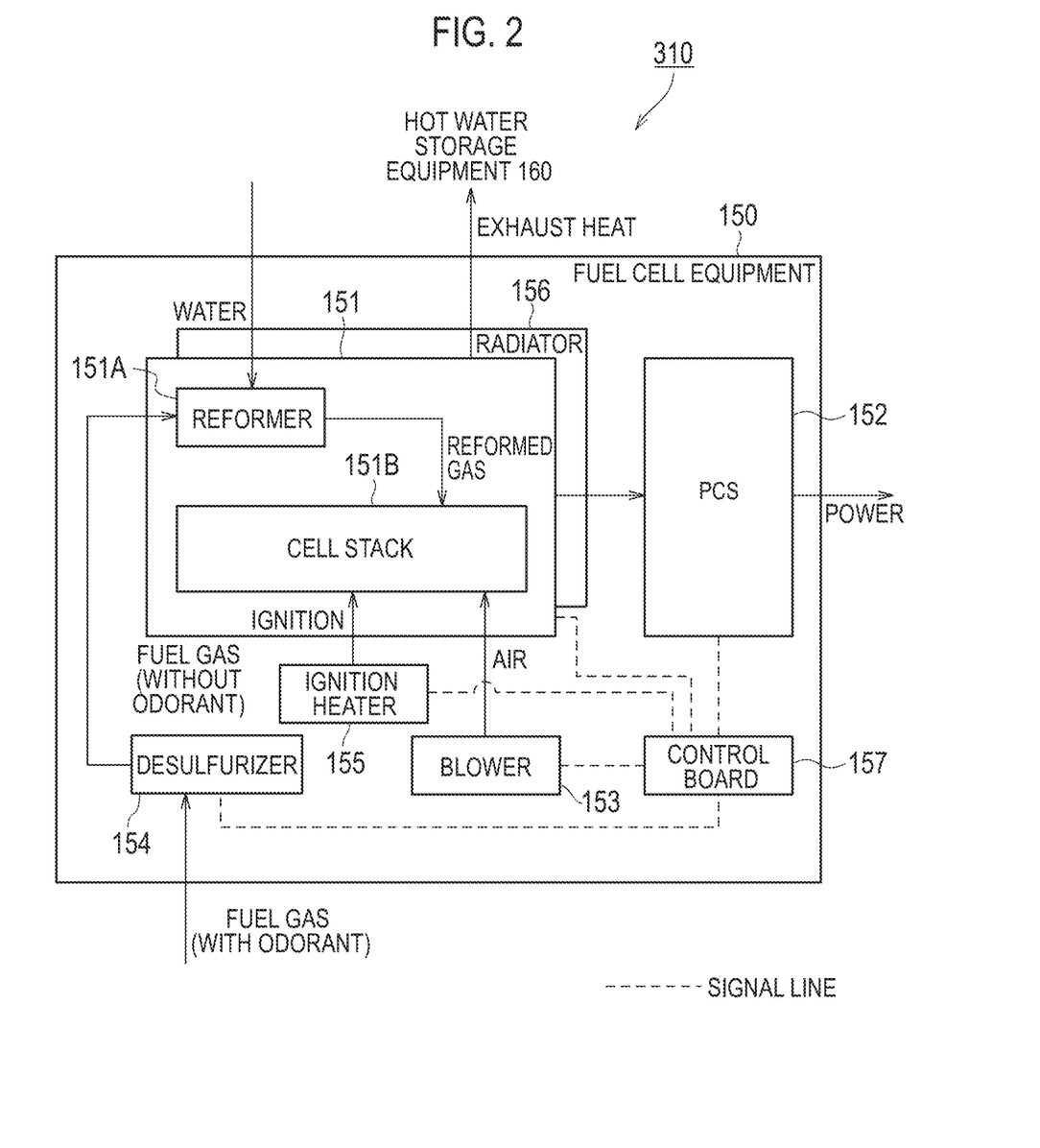
FIG. 2 is a diagram illustrating a fuel cell system 310 according to the embodiment.

Hereinafter, a fuel cell system according to the embodiment will be described. FIG. 2 is a diagram illustrating the fuel cell system 310 according to the embodiment. The fuel cell system 310 includes at least fuel cell equipment 150. The fuel cell system 310 may include hot water storage equipment 160. Here, the fuel cell system 310 will be described as being a cogeneration system including both the fuel cell equipment 150 and the hot water storage equipment 160.

The fuel cell equipment 150 is equipment that generates power using fuel, such as gas. The hot water storage equipment 160 is equipment that generates hot water or maintains a water temperature using fuel, such as gas. Specifically, the hot water storage equipment 160 has a hot water storage tank, warms water supplied from the hot water storage tank by heat generated by combustion of fuel or exhaust heat generated by power generation of the fuel cell equipment 150, and returns the warmed water to the hot water storage tank.

As illustrated in FIG. 2, the fuel cell equipment 150 has a fuel cell 151, a PCS 152, a blower 153, a desulfurizer 154, an ignition heater 155, a radiator 156, and a control substrate 157.

The fuel cell 151 is equipment that generates power using fuel. Specifically, the fuel cell 151 includes a reformer 151A and a cell stack 151B.

The reformer 151A generates reformed gas from fuel from which an odorant is removed by the desulfurizer 154 described later. The reformed gas is a gas including hydrogen and carbon monoxide.

The cell stack 151B generates power by a chemical reaction between air (oxygen) supplied from the blower 153 described later and the reformed gas. Specifically, the cell stack 151B has a structure in which a plurality of cells is stacked. Each cell has a structure in which an electrolyte is sandwiched between a fuel electrode and an air electrode. The reformed gas (hydrogen) is supplied to the fuel electrode, and air (oxygen) is supplied to the air electrode. A chemical reaction of the reformed gas (hydrogen) and the air (oxygen) occurs in the electrolyte to generate power (DC power) and heat.

The PCS 152 is equipment (power conditioning system) that converts DC power output from the fuel cell 151 into AC power.

The blower 153 supplies air to the fuel cell 151 (cell stack 151B). The blower 153 is configured with, for example, a fan. The blower 153 cools the cell stack 151B so that a temperature of the cell stack 151B does not exceed an upper limit of an allowable temperature.

The desulfurizer 154 removes the odorant contained in fuel supplied from the outside. The fuel may be city gas or propane gas.

The ignition heater 155 is a heater that ignites fuel (hereinafter, unreacted fuel) that does not react chemically in the cell stack 151B and maintains the temperature of the cell stack 151B at a high temperature. That is, the ignition heater 155 ignites unreacted fuel leaking from an opening of each cell constituting the cell stack 151B. It should be noted that the ignition heater 155 preferably ignites unreacted fuel in a case where the unreacted fuel is not combusted (for example, at the time of starting the fuel cell equipment 150). Then, after the combustion of the unreacted gas starts, the temperature of the cell stack 151B is maintained at a high temperature as the combustion of the unreacted fuel which overflows slightly from the cell stack 151B continues.

The radiator 156 cools water (hereinafter, reflux water) flowing from the hot water storage equipment 160 to the fuel cell equipment 150, so that a temperature of the reflux water does not exceed an upper limit of an allowable temperature. The radiator 156 may also cool the cell stack 151B so that the temperature of the cell stack 151B does not exceed an upper limit of an allowable temperature.

The control substrate 157 is a substrate, on which a circuit for controlling the fuel cell 151, the PCS 152, the blower 153, the desulfurizer 154, the ignition heater 155, and the control substrate 157 is mounted.

The reformer 151A, the blower 153, the desulfurizer 154, the ignition heater 155, and the control substrate 157 are an example of auxiliaries that assist operation of the cell stack 151B. Further, part of the PCS 152 may be treated as auxiliaries.

An operating state of the fuel cell system 310 includes a power generation state (also referred to as during power generation), a stop state (also referred to as during stoppage), a start state (also referred to as during start), a stopping operation state (also referred to as during stopping operation), an idle state (also referred to as during idling), and the like.

The power generation state is a state in which power generation is performed by the fuel cell 151. The start state is a state from the stop state to the power generation state. The stop state is a state in which operation of the fuel cell 151 is stopped. The stopping operation state is a state from the power generation state to the stop state. The idle state is a state in which power is not output from the fuel cell system 310, but the temperature of the cell stack 151B is maintained at a predetermined temperature. The predetermined temperature may be approximately the same as a power generation temperature (for example, 650° C. to 1000° C.) of the cell stack 151B in the power generation state, and may be a temperature (for example, 450° C. to 600° C.) lower than the power generation temperature. In the idle state, power of the auxiliaries may be covered by power output from the fuel cell 151, may be covered by power supplied from another distributed power supply (for example, equipment or storage battery equipment that generates power using natural energy), or may be covered by power supplied from the power grid 110.

In the example illustrated in FIG. 2, the control substrate 157 is provided in the fuel cell equipment 150. However, the embodiment is not limited to the above. The fuel cell system 310 may include a remote controller that receives user operation, and the control substrate 157 may be provided in a remote controller. Alternatively, a function of the control substrate 157 may be realized by both the substrate provided in the fuel cell equipment 150 and the remote controller.

Here, a control board 157 may have a function of avoiding an abnormality occurred in a fuel cell system 310 (abnormality avoiding function in the following). Here, the abnormality occurred in the fuel cell system 310 includes a first abnormality that is not predicted by the fuel cell system 310 (abnormality avoiding function), and a second abnormality predicted by the fuel cell system 310 (abnormality avoiding function). The control board 157 performs an operation of avoiding a second abnormality in a case where occurrence of the second abnormality is predicted by the abnormality avoiding function.

For example, the second abnormality may be a temperature abnormality in a cell stack 151B. In such a case, when it is assumed that the second abnormality is occurred in a case where a temperature of the cell stack 151B exceeds a predetermined threshold, the control board 157 predicts occurrence of the second abnormality in a case where the temperature of the cell stack 151B exceeds a threshold lower than the predetermined threshold. Alternatively, the second abnormality may be a rotation abnormality in a blower 153. In such a case, when it is assumed that a second abnormality is occurred in a case where a rotation speed of the blower 153 exceeds a predetermined threshold, the control board 157 predicts occurrence of the second abnormality in a case where the rotation speed of the blower 153 exceeds a threshold lower than the predetermined threshold.

(Equipment Management Apparatus)

Figure 3:
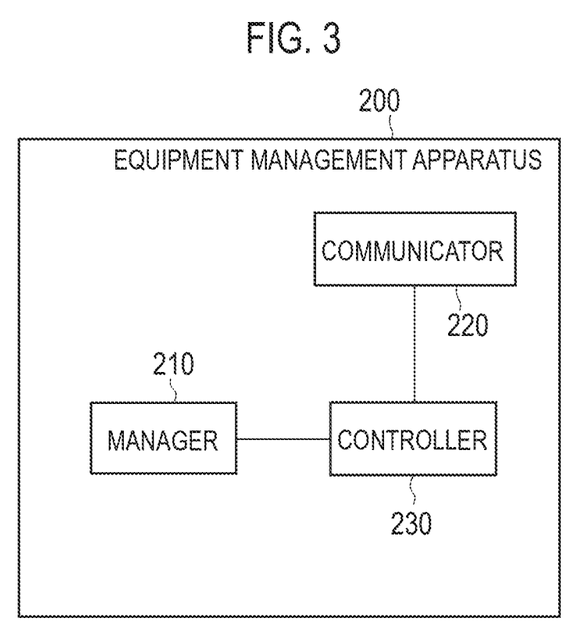
FIG. 3 is a diagram illustrating an equipment management apparatus 200 according to the embodiment.

Hereinafter, an equipment management apparatus according to the embodiment will be described. As illustrated in FIG. 3, the equipment management apparatus 200 includes a manager 210, a communicator 220, and a controller 230.

The manager 210 is configured with a storage medium, such as a non-volatile memory and/or an HDD, and manages information on a plurality of the facilities 300.

The manager 210 may store basic information of equipment provided in each of a plurality of the facilities 300. For example, the manager 210 stores a facility name, a facility ID, an equipment name, an equipment ID, an introduction year, aging, and a useful life by associating them with each other. The facility name is a name of the facility 300 where the equipment is installed. The facility ID is an identifier for identifying the facility 300. The equipment name is a name of equipment. The equipment ID is an identifier for identifying equipment. The introduction year is a year in which equipment is introduced. The aging indicates years that have passed since introduction of equipment. The useful life is determined by a manufacturer of equipment, and the like, and is information indicating a period in which equipment can be used appropriately after the equipment is introduced.

The manager 210 may store, for each of a plurality of the facilities 300, maintenance information of equipment provided in each of a plurality of the facilities 300. For example, the manager 210 stores a facility name, an equipment name, a maintenance date, a maintenance outline, and a maintenance detail by associating them with each other. The manager 210 may store a facility ID and an equipment ID by associating them with each other together with these pieces of information. The facility name and the equipment name are as described above. The maintenance date is a date on which maintenance is performed. The maintenance outline is information indicating an outline of maintenance, and the maintenance detail is information indicating the details of maintenance. The maintenance information according to the embodiment preferably includes at least a maintenance period (planned) for performing maintenance of equipment in the future. The maintenance information may include a maintenance period in which maintenance of equipment is performed in the past.

Here, the maintenance includes, for example, an inspection for examining a deterioration state of equipment, maintenance for performing minor maintenance at the time of inspection, a repair for dealing with a failure of equipment, replacement for replacing existing equipment with new equipment, and the like. Hereinafter, a case where the maintenance is a repair or replacement will be mainly described.

In the embodiment, a manager 210 manages an external factor with respect to the fuel cell system 310. The external factor may be input by an operator or may be acquired from an external server. Here, for example, the external factor includes at least one of a temperature in an installation area of the fuel cell system 310, weather in the installation area of the fuel cell system 310, air pollution in the installation area of the fuel cell system 310, a stop plan for gas supply with respect to the fuel cell system 310, and a stop plan for water supply with respect to the fuel cell system 310. The external factor may include the number of different equipments connected to a power grid 110, a kind of a different equipment, and a state of a different equipment (such as state of making reverse power flow). The external factor may include atmospheric pressure in the installation area of the fuel cell system 310.

A communicator 220 includes a communication module and performs communication with a facility 300 and a predetermined terminal 400 through a network 120. In a case where occurrence of a first abnormality is predicted by a controller 230, the communicator 220 configures a transmitter that transmits a message associated with the prediction for occurrence of the first abnormality. More specifically, the communicator 220 transmits, to the fuel cell system 310, a remote operation message including an information element instructing an operation of avoiding the first abnormality. The remote operation message may be transmitted through an EMS 320 or may not be transmitted through the EMS 320. The communicator 220 transmits, to the predetermined terminal 400, a warning message including an information element indicating that occurrence of the first abnormality is predicted.

The controller 230 includes a memory, a CPU, and the like and controls each configuration provided in an equipment management apparatus 200. In the embodiment, the controller 230 predicts occurrence of a first abnormality that is an abnormality not predicted by the fuel cell system 310 and that is an abnormality occurred in the fuel cell system 310. More specifically, the controller 230 predicts occurrence of the first abnormality on the basis of the external factor with respect to the fuel cell system 310.

Moreover, the controller 230 instructs the communicator 220 to transmit a remote operation message in a case where a communication function of the fuel cell system 310 is in an active state (hereinafter, also referred to as active). On the one hand, the controller 230 instructs the communicator 220 to transmit a warning message in a case where the communication function of the fuel cell system 310 is not active. Here, the active state means a state in which the communication function of the fuel cell system 310 can be used. For example, the active state at least includes a state in which the fuel cell system 310 can receive a message from the equipment management apparatus 200. The active state may include a state in which the fuel cell system 310 can transmit a message to the equipment management apparatus 200.

Here, the controller 230 may determine whether the communication function of the fuel cell system 310 is active on the basis of a blackout state in the installation area of the fuel cell system 310. More specifically, the controller 230 determines that the communication function of the fuel cell system is active in a case where there is no blackout in the installation area. The controller 230 determines that the communication function of the fuel cell system 310 is not active in a case where there is a blackout in the installation area. The controller 230 may determine whether the communication function of the fuel cell system 310 is active on the basis of a communication state between the equipment management apparatus 200 and the fuel cell system 310. The communication state may be determined based on whether a signal periodically transmitted from the fuel cell system 310 can be received or may be determined based on quality of a signal received from the fuel cell system 310. The communication state includes a state in which communication between the equipment management apparatus 200 and the fuel cell system 310 is disrupted in a case where power of the fuel cell system 310 (at least communication module) is off.

In the following, prediction for occurrence of a first abnormality will be described in detail for each external factor.

(A) Temperature in Installation Area

The fuel cell system 310 includes a circulatory grid that circulates a circulating liquid (such as water). When such a circulating liquid is frozen, an abnormality in the fuel cell system 310 is occurred. Thus, the controller 230 predicts occurrence of a first abnormality in a case where there is a possibility that a temperature in the installation area becomes lower than a freezing point of the circulating liquid. A possibility that the temperature in the installation area becomes lower than the freezing point of the circulating liquid may be determined on the basis of a current temperature that is a temperature in the present or may be determined on the basis of a predicted temperature that is a temperature in the future.

In such a case, the controller 230 may predict occurrence of a first abnormality on the basis of an operation state of the fuel cell system 310. In the above-described power generation state, activation state, and idling state, a temperature of the cell stack 151B is high or the temperature of the cell stack 151B is on the rise, whereby a low possibility that the circulating liquid is frozen. On the one hand, in the above-described stopped state and a stop operation state, the temperature of the cell stack 151B is low or the temperature of the cell stack 151B tends to fall, whereby there is a possibility that the circulating liquid is frozen. Thus, the controller 230 may predict occurrence of the first abnormality in a case where an operation state of the fuel cell system 310 is the stopped state or the stop operation state and there is a possibility that a temperature in the installation area becomes lower than the freezing point of the circulating liquid. Alternatively, the controller 230 may predict occurrence of the first abnormality in a case where the operation state of the fuel cell system 310 cannot be acquired.

In a case where occurrence of such a first abnormality is predicted, processing of removing the circulating liquid from the circulatory grid becomes necessary. In a case where the communication function of the fuel cell system 310 is active, the controller 230 instructs the communicator 220 to transmit a remote operation message giving an instruction for processing of removing the circulating liquid from the circulatory grid. The controller 230 instructs the communicator 220 to transmit a warning message in a case where the communication function of the fuel cell system 310 is not active.

(B) Weather in Installation Area

There is a possibility that an abnormality such as current leakage or water exposure is occurred by weather such as a heavy rain, a heavy snow, or a tornado. Thus, the controller 230 predicts occurrence of a first abnormality in a case where there is a possibility that a heavy rain, a heavy snow, or a tornado occurs. Weather in the installation area may be acquired from an external server such as a weather server.

In a case where occurrence of such a first abnormality is predicted, processing of stopping the fuel cell system 310 becomes necessary. In a case where the communication function of the fuel cell system 310 is active, the controller 230 instructs the communicator 220 to transmit a remote operation message giving an instruction to stop the fuel cell system 310. The controller 230 instructs the communicator 220 to transmit a warning message in a case where the communication function of the fuel cell system 310 is not active.

(C) Air Pollution in Installation Area

It is necessary that a chemical filter included in the fuel cell system 310 or a module included in the fuel cell system 310 is deteriorated by a contaminant such as sulfur oxide (SOx), nitrogen oxide (NOx), or PM2.5. Thus, the controller 230 predicts occurrence of a first abnormality in a case where there is a possibility that air pollution is generated. Air pollution in the installation area may be predicted from information acquired from an external server such as a weather server (such as distribution of contaminant and wind direction).

In a case where occurrence of such a first abnormality is predicted, processing of stopping the fuel cell system 310 becomes necessary. In a case where the communication function of the fuel cell system 310 is active, the controller 230 instructs the communicator 220 to transmit a remote operation message giving an instruction to stop the fuel cell system 310. The controller 230 instructs the communicator 220 to transmit a warning message in a case where the communication function of the fuel cell system 310 is not active.

(D) Interruption Plan for Gas Supply

When a gas supply is interrupted in a state in which the fuel cell system 310 is not stopped, there is a possibility that an abnormality is occurred in the cell stack 151B due to unanticipated stop of the gas supply. Thus, the controller 230 predicts occurrence of a first abnormality in a case where there is a plan of interrupting the gas supply. The stop plan for the gas supply may be acquired from a gas company.

In a case where occurrence of such a first abnormality is predicted, processing of stopping the fuel cell system 310 becomes necessary. In a case where the communication function of the fuel cell system 310 is active, the controller 230 instructs the communicator 220 to transmit a remote operation message giving an instruction to stop the fuel cell system 310. The controller 230 instructs the communicator 220 to transmit a warning message in a case where the communication function of the fuel cell system 310 is not active.

(E) Interruption Plan for Water Supply

When water supply is interrupted in a state in which the fuel cell system 310 is not stopped, there is a possibility that a reformer 151A is deteriorated by unanticipated stop of the water supply. Moreover, in a case where the water supply is resumed, there is a possibility that a filter included in the reformer 151A is deteriorated. Thus, the controller 230 predicts occurrence of a first abnormality in a case where there is a plan of interrupting the water supply. The stop plan for the water supply may be acquired from a water company.

In a case where occurrence of such a first abnormality is predicted, processing of stopping the fuel cell system 310 becomes necessary. In a case where the communication function of the fuel cell system 310 is active, the controller 230 instructs the communicator 220 to transmit a remote operation message giving an instruction to stop the fuel cell system 310. The controller 230 instructs the communicator 220 to transmit a warning message in a case where the communication function of the fuel cell system 310 is not active.

(F) Other

For example, there is a possibility that voltage of the power grid 110 becomes higher as the number of different equipments that can make a reverse power flow or the number of different equipments in a state of making a reverse power flow becomes larger, and occurrence of a first abnormality is predicted. In a case where occurrence of such a first abnormality is predicted, there is a possibility that processing of stopping the fuel cell system 310 becomes necessary.

For example, in a case where atmospheric pressure in the installation area of the fuel cell system 310 is decreased rapidly, occurrence of a first abnormality is predicted similarly to a case of weather in the installation area. In a case where occurrence of such a first abnormality is predicted, there is a possibility that processing of stopping the fuel cell system 310 becomes necessary.

(Equipment Management Method)

Figure 4:
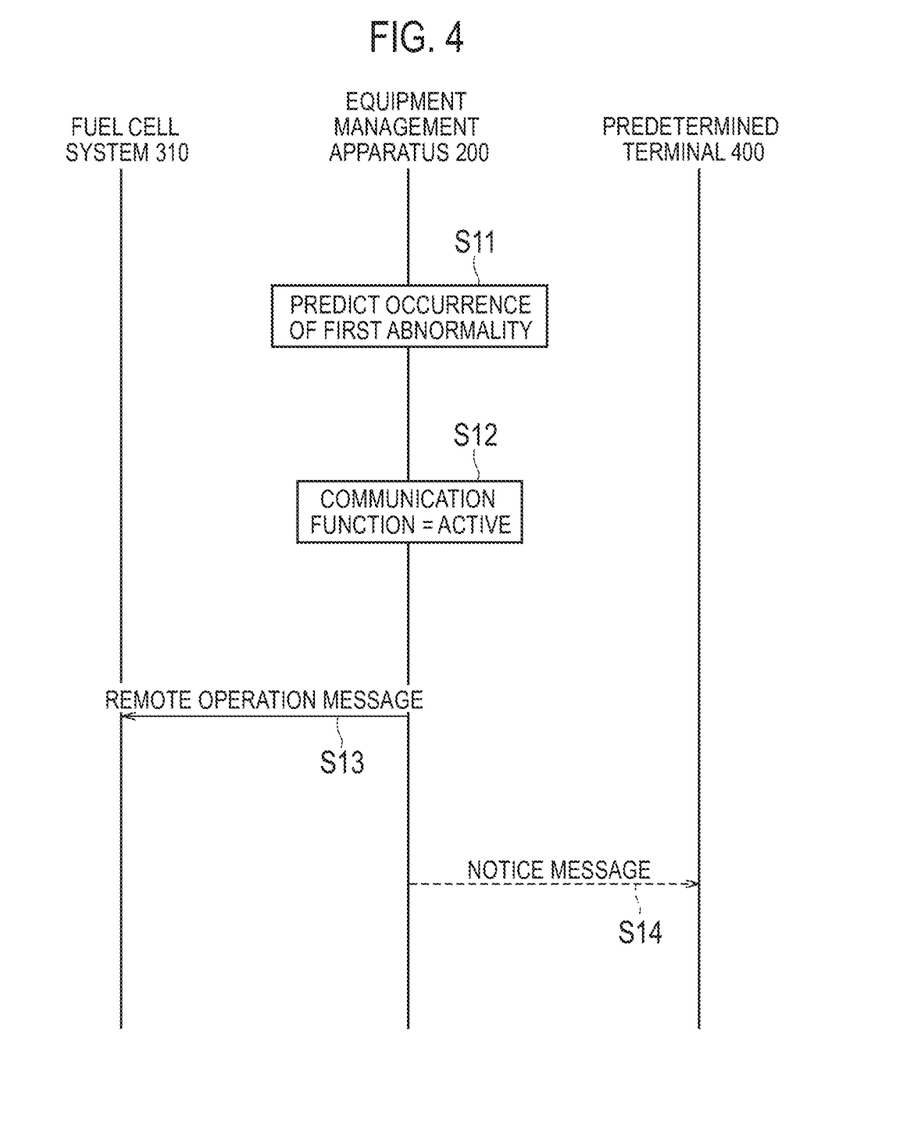
FIG. 4 is a view illustrating an equipment management method according to an embodiment.
Figure 5:
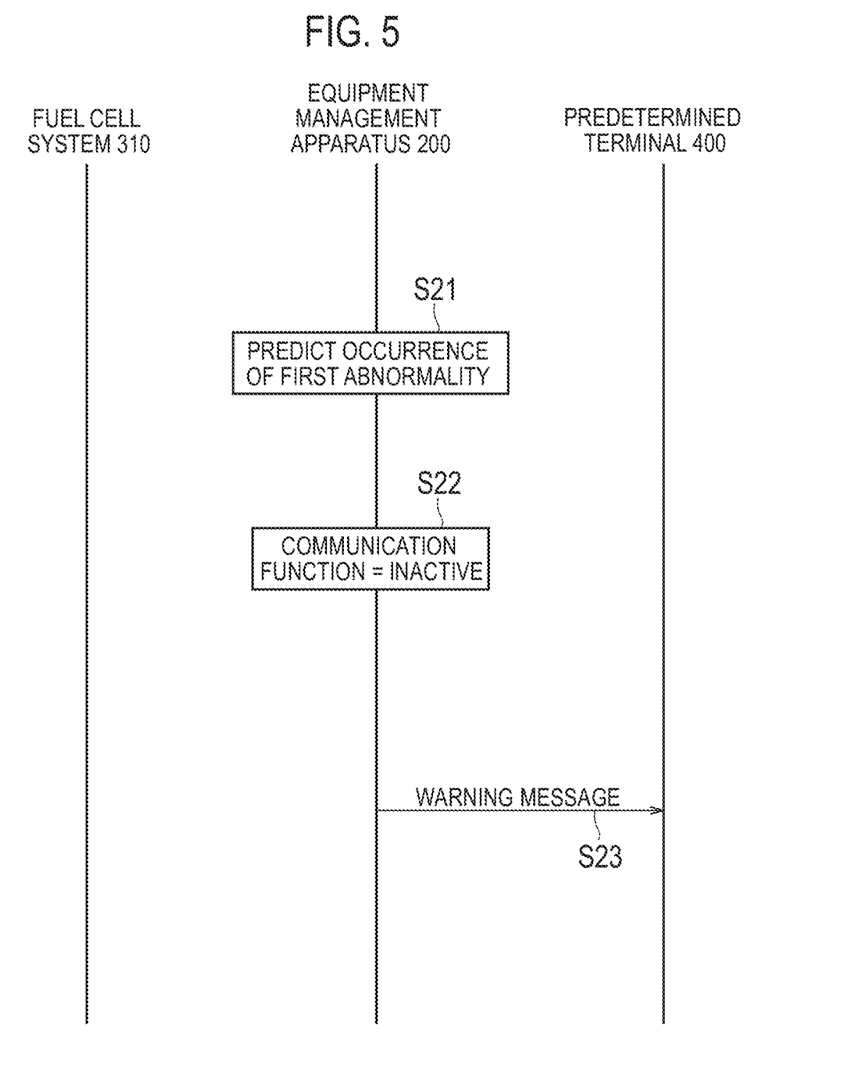
FIG. 5 is a view illustrating an equipment management method according to the embodiment.
Figure 6:
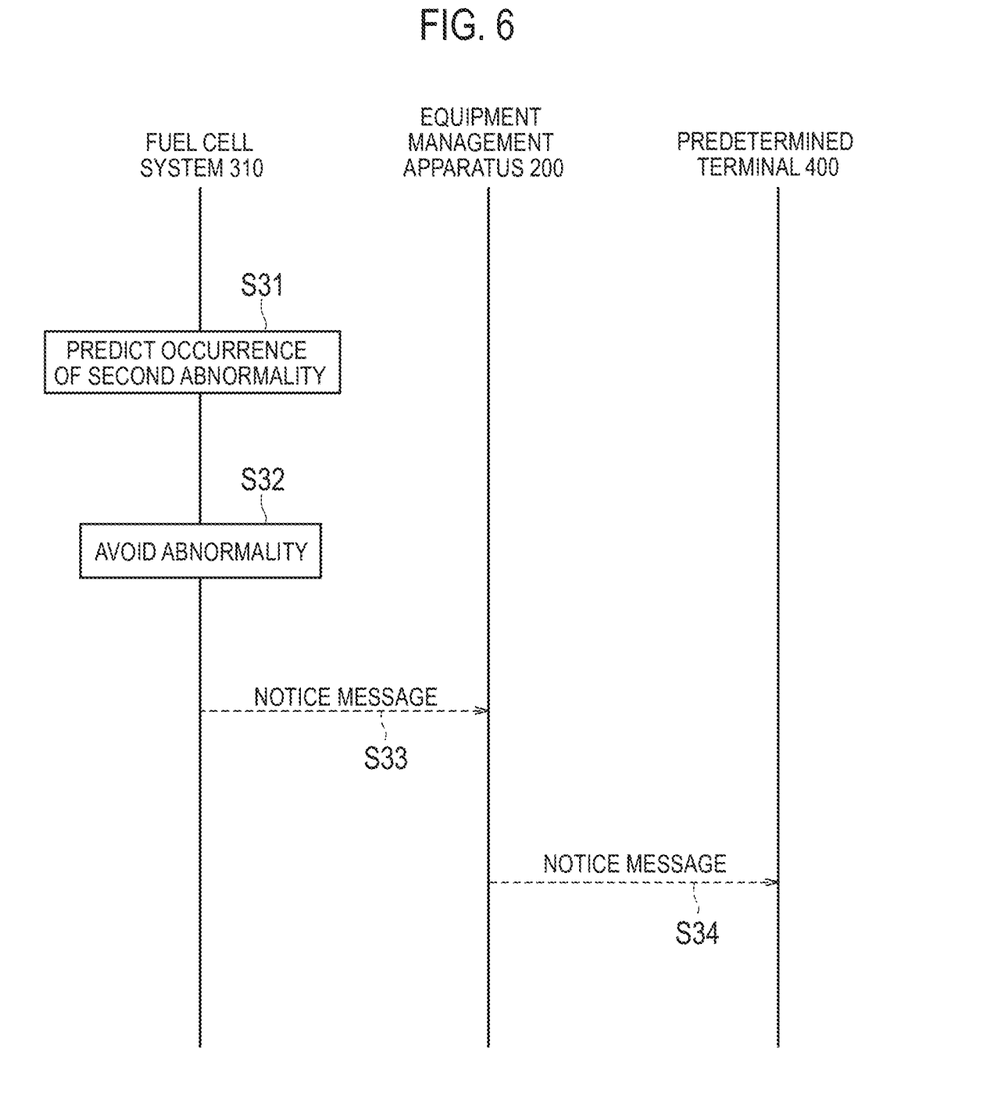
FIG. 6 is a view illustrating an equipment management method according to the embodiment.

In the following, an equipment management method according to the embodiment will be described. In FIG. 4 to FIG. 6, the EMS 320 is omitted. However, communication between the fuel cell system 310 and the equipment management apparatus 200 may be transmitted through the EMS 320.

First, a case where occurrence of a first abnormality is predicted and a communication function of the fuel cell system 310 is active will be described.

As illustrated in FIG. 4, the equipment management apparatus 200 predicts occurrence of the first abnormality in step S11. A method of predicting occurrence of the first abnormality is in a manner described above.

In step S12, the equipment management apparatus 200 determines that the communication function of the fuel cell system 310 is active.

In step S13, the equipment management apparatus 200 transmits, to the fuel cell system 310, a remote operation message including an information element giving an instruction for an operation of avoiding the first abnormality.

In step S14, the equipment management apparatus 200 may transmit, to the predetermined terminal 400, a notice message including information indicating that the remote operation message is transmitted to the fuel cell system 310, that is, a notice message including an information element indicating that an instruction for an operation of avoiding the first abnormality is given.

Second, a case where occurrence of a first abnormality is predicted and a communication function of the fuel cell system 310 is not active will be described.

As illustrated in FIG. 5, the equipment management apparatus 200 predicts occurrence of the first abnormality in step S21. A method of predicting occurrence of the first abnormality is in a manner described above.

In step S22, the equipment management apparatus 200 determines that the communication function of the fuel cell system 310 is not active.

In step S23, the equipment management apparatus 200 transmits, to the predetermined terminal 400, a warning message including an information element indicating that occurrence of the first abnormality is predicted.

Third, a case where occurrence of a second abnormality is predicted will be described.

As illustrated in FIG. 6, the fuel cell system 310 predicts occurrence of the second abnormality by the abnormality avoiding function in step S31.

In step S32, the fuel cell system 310 performs an operation of avoiding the second abnormality by the abnormality avoiding function.

In step S33, the fuel cell system 310 may transmit, to the equipment management apparatus 200, a notice message including an information element indicating that the operation of avoiding the second abnormality is performed.

In step S34, the equipment management apparatus 200 may transmit, to the predetermined terminal 400, the notice message including the information element indicating that the operation of avoiding the second abnormality is performed.

(Action and Effect)

In the embodiment, the equipment management apparatus 200 predicts occurrence of a first abnormality that is an abnormality not predicted by the fuel cell system 310 and that is an abnormality occurred in the fuel cell system 310. Moreover, in a case where occurrence of the first abnormality is predicted, the equipment management apparatus 200 transmits a message associated with the prediction for occurrence of the first abnormality. Thus, even when there is a possibility that an abnormality that cannot be handled only by the abnormality avoiding function included in the fuel cell system 310 is occurred, it is possible to avoid such an abnormality appropriately.

Other Embodiments

The present invention has been described based on the embodiment described above. However, a statement and the drawings constituting part of the disclosure should not be understood as limiting the present invention. This disclosure will clarify a variety of alternative embodiments, examples, and operation techniques for a person skilled in the art.

In the embodiment, the manager 210 is provided in the equipment management apparatus 200, but the embodiment is not limited to this. For example, the manager 210 may be provided in a server connected to the equipment management apparatus 200 via the network 120.

In the embodiment, the fuel cell system 310 has the abnormality avoiding function. However, the embodiment is not limited to this. A abnormality avoiding function included in a fuel cell system 310 may be included in an EMS 320.

In the embodiment, occurrence of a first abnormality is predicted by the equipment management apparatus 200. However, the embodiment is not limited to this. Generation of a first abnormality may be predicted by an EMS 320. In such a case, the EMS 320 may be considered as an equipment management apparatus. Moreover, an EMS 320 may function as an equipment management apparatus by a cloud service of a server connected through a network 120. The server that provides the cloud service may be an equipment management apparatus 200.

In the embodiment, a warning message includes an information element indicating that occurrence of a first abnormality is predicted. A warning message may include an information element indicating the above-described external factor. Such an information element is an information element indicating a reason why occurrence of a first abnormality is predicted. Priority of the warning message including the information element indicating that occurrence of the first abnormality is predicted may be higher than priority of a different notice message. As priority becomes higher, a display mode of a message, or the like may be emphasized more. For example, a different notice message may be a message including an information element indicating that occurrence of a second abnormality is predicted, a notice message including an information element indicating that an operation of avoiding a second abnormality is performed, or a notice message including an information element indicating that an instruction for an operation of avoiding a first abnormality is given. A different notice message may be a message including an information element indicating that an abnormality is occurred in a fuel cell system 310.

At least one of an equipment management apparatus 200, a fuel cell system 310, and a predetermined terminal 400 may include a display that displays various messages. Various messages are, for example, a message including an information element indicating that occurrence of a first abnormality is predicted, a message including an information element indicating that occurrence of a second abnormality is predicted, a notice message including an information element indicating that an operation of avoiding a second abnormality is performed, and a notice message including an information element indicating that an instruction for an operation of avoiding a first abnormality is given.

The fuel cell equipment 150 is a solid oxide fuel cell (SOFC). However, the fuel cell equipment 150 may be a polymer electrolyte fuel cell (PEFC), a phosphoric acid fuel cell (PAFC), or a molten carbonate fuel cell (MCFC).

Note that Japanese Patent Application No. 2017-106301 (filed on May 30, 2017) is incorporated in the present description by reference in its entirety.

The invention claimed is:

1. An equipment management method, comprising:
   predicting, at an equipment management apparatus, occurrence of a first abnormality which is an abnormality in a fuel cell system and not predicted by the fuel cell system; and
   transmitting, at the equipment management apparatus, a message associated with a prediction for the occurrence of the first abnormality when the occurrence of the first abnormality is predicted,
   wherein
   the transmitting the message includes transmitting, to the fuel cell system, a remote operation message as the message when a communication function of the fuel cell system is in an active state, and
   the remote operation message includes an information element instructing for an operation of avoiding the first abnormality.

2. The equipment management method according to claim 1, further comprising:
   performing, at the fuel cell system, an operation of avoiding a second abnormality which is an abnormality in the fuel cell system and occurrence of which is predicted by an abnormality avoiding function included in the fuel cell system,
   wherein the first abnormality is an abnormality which is not predicted by the abnormality avoiding function.

3. The equipment management method according to claim 1,
   wherein the transmitting the message further includes transmitting, to a predetermined terminal, a warning message when the communication function of the fuel cell system is not in the active state, and
   wherein the warning message includes an information element indicating that the occurrence of the first abnormality is predicted.

4. The equipment management method according to claim 1,
   wherein the predicting the occurrence of the first abnormality includes predicting the occurrence of the first abnormality based on an external factor for the fuel cell system.

5. The equipment management method according to claim 1,
   wherein the predicting the occurrence of the first abnormality includes predicting the occurrence of the first abnormality based on an external factor including at least one of a temperature in an installation area of the fuel cell system, weather in the installation area of the fuel cell system, air pollution in the installation area of the fuel cell system, a stop plan for gas supply for the fuel cell system, or a stop plan for water supply for the fuel cell system.

6. The equipment management method according to claim 1,
   wherein the transmitting the message includes determining whether the communication function of the fuel cell system is in the active state based on at least one of a blackout state in an installation area of the fuel cell system, or a communication state between the equipment management apparatus and the fuel cell system.

7. An equipment management apparatus, comprising:
   a controller configured to predict occurrence of a first abnormality which is an abnormality in a fuel cell system and not predicted by the fuel cell system; and
   a transmitter configured to transmit a message associated with a prediction for the occurrence of the first abnormality when the occurrence of the first abnormality is predicted,
   wherein
   the transmitter is configured to transmit, to the fuel cell system, a remote operation message as the message when a communication function of the fuel cell system is in an active state, and
   the remote operation message includes an information element instructing for an operation of avoiding the first abnormality.

* * * * *